United States Patent [19]

Kaneiwa et al.

[11] Patent Number: 4,745,616
[45] Date of Patent: May 17, 1988

[54] SEMICONDUCTOR LASER DEVICE WITH A DIFFRACTION GRATING

[75] Inventors: Shinji Kaneiwa; Haruhisa Takiguchi, both of Nara; Toshihiko Yoshida; Sadayoshi Matsui, both of Tenri, all of Japan

[73] Assignee: Sharp Kabushiki Kaisha, Osaka, Japan

[21] Appl. No.: 830,864

[22] Filed: Feb. 19, 1986

[30] Foreign Application Priority Data

Feb. 19, 1985 [JP] Japan .................................. 60-33603

[51] Int. Cl.⁴ .............................................. H01S 3/19
[52] U.S. Cl. .......................................... 372/96; 372/45
[58] Field of Search ..................................... 372/96, 45

[56] References Cited

U.S. PATENT DOCUMENTS 4,025,939 5/1977 Aiki et al. .............................. 372/96
4,340,966 7/1982 Akiba et al. ........................... 372/45
4,704,720 11/1987 Yamaguchi ............................ 372/45

FOREIGN PATENT DOCUMENTS 58-197788 11/1983 Japan.

OTHER PUBLICATIONS

J. L. Merz, "III-V heterostructure devices...," *Optical Engineering*, vol. 19, No. 4, Jul./Aug. 1980, pp. 581-586.

*Primary Examiner*—James W. Davie
*Attorney, Agent, or Firm*—Birch, Stewart, Kolasch & Birch

[57] ABSTRACT

A semiconductor laser device comprising a GaAlAs first cladding layer, a $Ga_{1-x}Al_xAs$ ($0 \leq x \leq 0.4$) active layer for laser oscillation, an $In_{1-y}Ga_yP_{1-z}As_z$ ($z=2.04y-1.04$, and $0 \leq z \leq 1$) optical guiding layer with a diffraction grating thereon, a GaAlAs buffer layer disposed between said active layer and said optical guiding layer, and a GaAlAs second cladding layer, the width of the forbidden band of said buffer layer being greater than that of the active layer and smaller than that of the optical guiding layer.

16 Claims, 2 Drawing Sheets

SEMICONDUCTOR LASER DEVICE WITH A DIFFRACTION GRATING

BACKGROUND OF THE INVENTION

1. Field of the invention:

This invention relates to a distributed feedback semiconductor laser device and/or a distributed Bragg reflection semiconductor laser device which attains laser oscillation at a wavelength ranging from 660 to 890 nm in a single longitudinal mode.

2. Description of the prior art:

Semiconductor laser devices, which are used as light sources for optical information processing systems and/or optical measurement systems utilizing optical fibers therein, are required to have operation characteristics achieving laser oscillation in a single longitudinal mode. As laser devices achieving laser oscillation in a single longitudinal mode, distributed feedback semiconductor lasers and distributed Bragg reflection semiconductor lasers which have a diffraction grating with a periodic corrugation on or near the active region are known (Nikkei Electronics Vol. 12, No. 22 pp 66–70 (1981)).

FIG. 2 shows a typical conventional distributed feedback semiconductor laser, which comprises an n-InP substrate 10, an n-InP cladding layer (buffer layer) 20, a non-doped InGaPAs active layer 30, a p-InGaPAs optical guiding layer 40, a p-InP cladding layer 50 and a p-InGaPAs cap layer 60, in sequence. A p-sided ohmic electrode 70 and an n-sided ohmic electrode 80 are disposed on the cap layer 60 and the substrate 10, respectively. A diffraction grating 401 for laser oscillation is formed on the upper surface of the optical guiding layer 40. This laser device utilizes the InGaPAs-InP system which achieves laser oscillation at a wavelength of as long as 1.3–1.55 μm.

On the other hand, a semiconductor laser device attaining laser oscillation at a shorter wavelength of 890 nm or less comprises, as shown in FIG. 3, an n-GaAs substrate 100, an n-GaAlAs cladding layer 200, a non-doped GaAs or GaAlAs active layer 300, a p-GaAlAs optical guiding layer 400, a p-GaAlAs cladding layer 500 and a P-GaAs cap layer 600, in sequence. However, this laser has the GaAlAs cladding layer 500 on a diffraction grating 401 which is formed on the GaAlAs optical guiding layer 400, so that the GaAlAs alloy crystal is readily oxidized in the atmosphere in the formation process of the diffraction grating 401 to thereby form an oxide film on the GaAlAs optical guiding layer 400 which makes it difficult to grow the succeeding crystal (i.e., the GaAlAs cladding layer 500) thereon. Thus, it can be said that semiconductor lasers having a diffraction grating therein for laser oscillation at a wavelength of as short as 890 nm or less have not yet been sufficiently developed.

In order to eliminate this problem, a distributed feedback semiconductor laser device, in which an InGaPAs crystal is used as a material for the optical guiding layer instead of the GaAlAs crystal, has been proposed by the inventors in U.S. patent application Ser. No. 789,787. This distributed feedback semiconductor laser device is produced as follows: As shown in FIG. 4, on an n-GaAs substrate 110, an n-GaAlAs cladding layer 210, a non-doped GaAs active layer 310, a p-InGaPAs optical guiding layer 410, a p-GaAlAs cladding layer 510 and a p-GaAs cap layer 610 are successively formed by liquid phase epitaxy. An n-sided ohmic metal electrode 710 and a p-sided ohmic metal electrode 810 are then formed on the cap layer 610 and the substrate 110, respectively. A diffraction grating 444 for laser oscillation is formed on the upper surface of the optical guiding layer 410. According to the above-mentioned laser structure, the optical guiding layer 410 is not oxidized so that the growth of the succeeding crystal thereon can be easily achieved. However, the difference in the thermal expansion coefficient between the active layer 310 and the optical guiding layer 410 causes a lattice mismatch, etc., which allows the introduction of lattice distortion into the interface therebetween, to thereby create a large amount of nonradiative recombination current resulting in an increase in the laser oscillation threshold and deterioration in device characteristics.

SUMMARY OF THE INVENTION

The semiconductor laser device of this invention which overcomes the above-discussed and numerous other disadvantages and deficiencies of the prior art, comprises a GaAlAs first cladding layer, a $Ga_{1-x}Al_xAs$ ($0 \leq x \leq 0.4$) active layer for laser oscillation, an $In_{1-y}Ga_yP_{1-z}As_z$ ($z = 2.04y - 1.04$, and $0 \leq z \leq 1$) optical guiding layer with a diffraction grating thereon, a GaAlAs buffer layer disposed between said active layer and said optical guiding layer, and a GaAlAs second cladding layer, the width of the forbidden band of the buffer layer being greater than that of the active layer and smaller than that of the optical guiding layer.

When the forbidden band widths of said active layer, said buffer layer, said optical guiding layer, and said first and second cladding layers are $E_3$, $E_9$, $E_4$, and $E_2$, and $E_5$, respectively, the following relationships therebetween are achieved in a preferred embodiment:

$E_3 < E_9 \leq E_4 < E_2$ & $E_5$, and $E_2$ & $E_5 - E_3 > 0.3$ eV

The oscillation wavelength of the semiconductor laser device is, in a preferred embodiment, in the range of 660 to 890 nm.

Thus, the invention described herein makes possible the object of providing a novel distributed feedback semiconductor laser device and/or a novel distributed Bragg reflection semiconductor laser device in which a GaAlAs buffer layer is disposed between the GaAlAs active layer for laser oscillation and the InGaPAs optical guiding layer having a diffraction grating thereon, and thus lattice distortion at the interface between the active layer and the adjacent layer thereof can be reduced, so that the resulting laser device is excellent in device characteristics and reliability.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
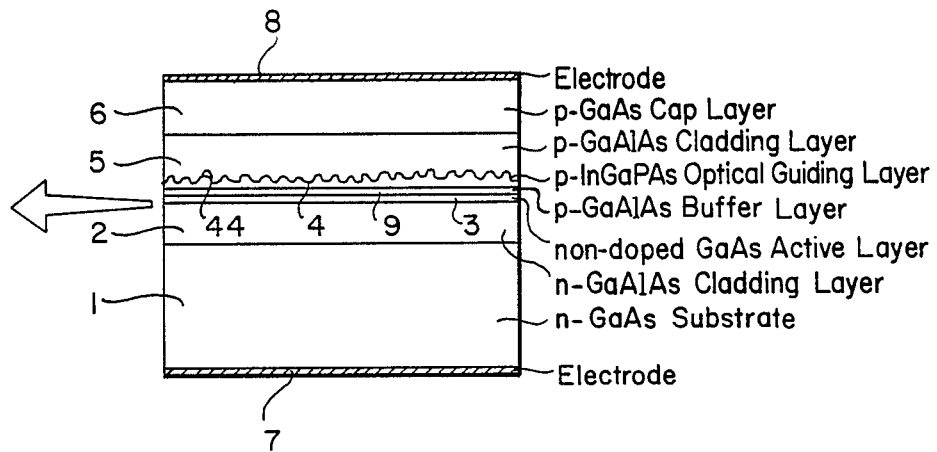
FIG. 1 is a cross sectional view in the resonance direction showing a distributed feedback semiconductor laser device attaining laser oscillation at a wavelength of 890 nm or less according to this invention.
Figure 2:
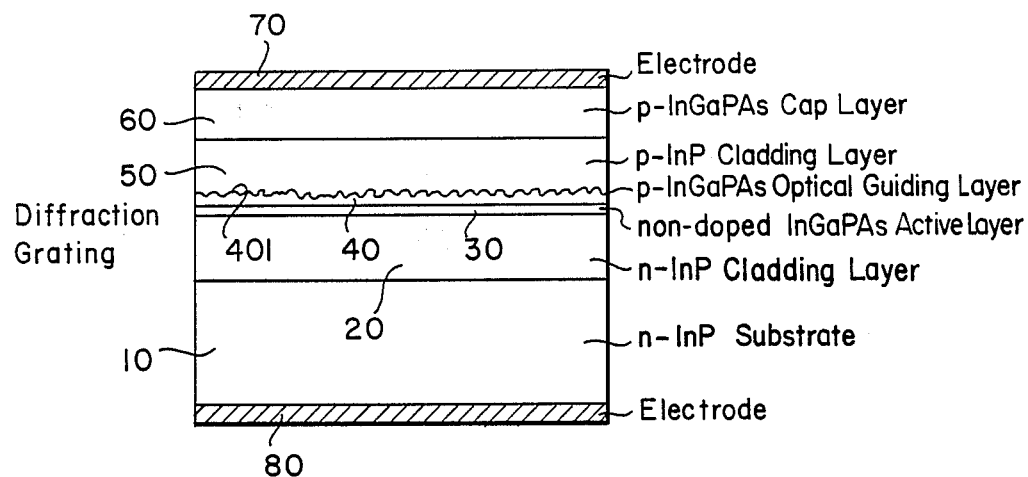
FIG. 2 is a cross sectional view showing a conventional distributed feedback semiconductor laser device attaining laser oscillation at a wavelength of 1,300 nm.
Figure 3:
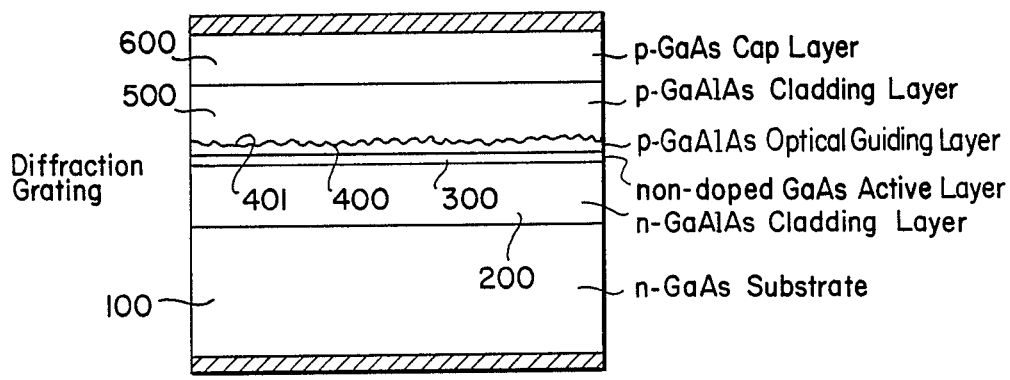
FIG. 3 is a cross sectional view showing a conventional distributed feedback semiconductor laser device attaining laser oscillation at a wavelength of 890 nm or less.
Figure 4:
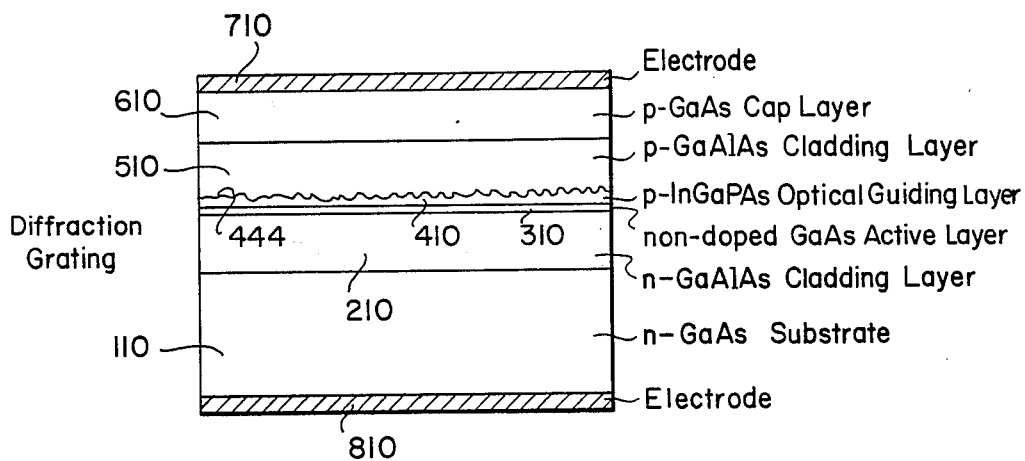
FIG. 4 is a cross sectional view showing another conventional distributed feedback semiconductor laser device attaining laser oscillation at a wavelength of 890 nm or less.

FIG. 1 shows a semiconductor laser device of this invention, which comprises an n-GaAs substrate 1, an n-GaAlAs first cladding layer 2, a nondoped GaAs active layer 3, a p-GaAlAs buffer layer 9, a p-InGaPAs optical guiding layer 4, a p-GaAlAs second cladding layer 5, and a p-cap layer 6, in sequence. This semiconductor laser device is produced as follows: On the n-GaAs substrate 1, the n-GaAlAs cladding layer 2, the non-doped GaAs active layer 3, the p-GaAlAs buffer layer 9 and the p-InGaPAs optical guiding layer 4 are successively grown by liquid phase epitaxy. On the optical guiding layer 4, a photo-resist is then coated to form a photo-resist film, which is then subjected to an interference exposure treatment using an ultraviolet ray laser, resulting in a diffraction grating of the photo-resist film with 2500 Å intervals. Grooves are formed on the optical guiding layer 4 by a chemical etching technique, using the resulting photo-resist diffraction grating as a mask, and then the photo-resist film is removed, resulting in a diffraction grating 44 with a corrugation having a periodicity of 2500 Å on the optical guiding layer 4. Then, on the optical guiding layer 4 having the diffraction grating 44 thereon, the p-GaAlAs cladding layer 5 and the p-GaAs cap layer 6 are successively grown by liquid phase epitaxy. An n-sided ohmic metal electrode 7 and a p-sided ohmic metal electrode 8, both of which are made of Au, Ge, Ni, etc., are then formed on the substrate 1 and the cap layer 6, respectively. The thickness of the active layer 3 is approximately 0.1 μm, the thickness of the buffer layer 9 is approximately 0.2 μm, and the thickness of the optical guiding layer 4 is approximately 0.3 μm. It is preferable that the sum of the thickness of the buffer layer 9 and the optical guiding layer 4 is approximately 0.5 μm or less.

In this Example, the multi-layered doubleheterostructure for laser operation includes the active layer 3 of GaAs and the cladding layers 2 and 5 of an alloy crystal of $Ga_{1-x}Al_xAs$ (the composition ratio x being 0.2 or more), resulting in a semiconductor laser device having an oscillation wavelength of approximately 880 nm. The optical guiding layer 4 is a quaternary alloy crystal of $In_{1-y}Ga_yP_{1-z}As_z$, wherein $0.68 \leq y \leq 1$, $0.34 \leq z \leq 1$, and $z = 2.04y - 1.04$. The forbidden band width of the optical guiding layer 4 is set between that of the active layer 3 and that of each of the cladding layers 2 and 5. The refractive index of the optical guiding layer 4 is also set between that of the active layer 3 and that of each of the cladding layers 2 and 5. The buffer layer 9 is of $Ga_{1-x}Al_xAs$, the composition ratio x of which is set in such a manner that the forbidden band width of the buffer layer 9 lies between that of the active layer 3 and that of the optical guiding layer 4, or is equal to that of the optical guiding layer 4.

In order to obtain a semiconductor laser device having an oscillation wavelength of 890 nm or less, it is preferable that the active layer 3 is composed of $Ga_{1-x}Al_xAs$ (the composition ratio x being selected to be $0 \leq x \leq 0.4$) or an impurity such as Zn, Si or the like is doped into the active layer 3, and the cladding layers 2 and 5 are composed on $Ga_{1-x}Al_xAs$ (the composition ratio x being selected to be higher than that of the active layer 3 in the range of 0.2 to 1, i.e., $0.2 \leq x \leq 1$), and moreover the cladding layers 2 and 5 have a higher forbidden band width than the active layer 3 by 0.3 eV or more. Semiconductor laser devices obtained under the above-mentioned conditions have an oscillation wavelength ranging from 660 to 890 nm. The forbidden band width of each of the optical guiding layer 4 and the buffer layer 9 is also set depending upon that of the active layer 3. That is, when the forbidden band widths of the active layer 3, the buffer layer 9, the optical guiding layer 4, and the cladding layers 2 and 5 are $E_3$, $E_9$, $E_4$ and $E_2$ & $E_5$, respectively, the following relationships therebetween are achieved:

$$E_3 < E_9 \leq E_4 < E_2 \text{ \& } E_5, \text{ and}$$

$$E_2 \text{ \& } E_5 - E_3 > 0.3 \text{ eV}$$

In the above-mentioned Examples of this invention, the GaAlAs buffer layer 9 is disposed between the $Ga_{1-x}Al_xAs$ ($0 \leq x \leq 0.4$) active layer 3 and the InGaPAs optical guiding layer 4, and the element atoms of the active layer 3 are almost equal to those of the buffer layer 9. Thus, the difference in the thermal expansion coefficient between the active layer 3 and the buffer layer 9 is small, and accordingly there is little lattice mismatch therebetween, so that the lattice distortion causing an interface level can be reduced. On the other hand, the lattice mismatch exists to some extent between the buffer layer 9 and the optical guiding layer 4, but it does not lie at the interface of the active layer 3 which is directly related to radiation, and accordingly it has little influence on the device characteristics of the semiconductor laser device.

When a carrier is injected into the semiconductor laser device through the n-sided electrode 7 and the p-sided electrode 8, laser operation begins in the active layer 3. The resonance of the laser light arises in the lateral direction in FIG. 1. Current injected therein is contracted in the band-shaped electroconductive region based on the inner-striped structure thereof, and the laser light is emitted, as shown by an arrow mark in FIG. 1, from the facets which are positioned at both sides of the active layer 3 corresponding to the electroconductive region. The oscillation wavelength depends upon the periodicity of the diffraction grating 44 corresponding to the wavelength of the laser light, a stabilized laser oscillation can be attained in a single longidutinal mode. Thus, this semiconductor laser device has output power characteristics which can be applied with high precision to a light source for long distance optical information processing systems and/or optical measurment systems.

The above-mentioned Examples disclose only distributed feedback semiconductor laser devices, but are not limited thereto. This invention is, of course, applicable to distributed Bragg reflection semiconductor laser devies, as well.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor laser device having an optical structure comprising:
   a GaAlAs first cladding layer,
   an $Ga_{1-x}Al_xAs$ ($0 \leq x \leq 0.4$) active layer for laser oscillation formed on said first cladding layer,
   a GaAlAs buffer layer formed on said active layer,
   an $In_{1-y}Ga_yP_{1-z}As_z$ ($z = 2.04y - 1.04$, and $0 \leq z \leq 1$) optical guiding layer having a diffraction grating thereon formed on said buffer layer, and
   a GaAlAs second cladding layer formed on said optical guiding layer,
   wherein the width of the forbidden band of said buffer layer is greater than that of said active layer and smaller than that of said optical guiding layer.

2. A semiconductor laser device according to claim 1, wherein the forbidden band widths of said active layer, said buffer layer, said optical guiding layer, said first cladding layer, and second cladding layer are $E_3$, $E_9$, $E_4$, $E_2$, and $E_5$, respectively, and the following relationships therebetween are achieved:

$E_3 < E_9 [\leq E_4 < E_2 \text{ \& } E_5], <E_4 < E_2 \text{\&} E_5$, and $[E_2 \ E_5] \ E_2 \text{\&} E_5 - E_3 \geq 0.3$ eV.

3. A semiconductor laser device according to claim 1, wherein the oscillation wavelength thereof is 890 nm or less.

4. A semiconductor laser device according to claim 3, wherein the oscillation wavelength thereof is in the range of 660 to 890 nm.

5. A semiconductor laser device according to claim 2, wherein the oscillation wavelength thereof is 890 nm or less.

6. A semiconductor laser device according to claim 4, wherein said optical guiding layer comprises $In_{1-y}Ga_yP_{1-z}As_z$ ($0.68 \leq y \leq 1$, $0.34 \leq z \leq 1$, and $z = 2.04y - 1.04$), and wherein said first cladding layer and said second cladding layer comprise $Ga_{1-x}Al_xAs$ ($0.2 \leq x \leq 1$).

7. A semiconductor laser device according to claim 6, wherein the refractive index of said optical guiding layer is between that of said active layer and that of said first and second cladding layers.

8. A semiconductor laser device according to claim 7, wherein said diffraction grating on said optical guiding layer comprises a corrugation having a periodicity of 2500 angstroms.

9. A semiconductor laser device according to claim 8, wherein said first cladding layer is formed on a semiconductor substrate, a cap layer is formed on said second cladding layer, and electrodes are formed on said cap layer and said substrate.

10. A semiconductor laser device according to claim 9, wherein said laser device is a distributed feedback semiconductor laser device or a distributed Bragg reflection semiconductor laser device.

11. A semiconductor laser device having an optical structure comprising:
    a GaAlAs first cladding layer,
    a non-doped GaAs active layer for laser oscillation formed on said first cladding layer,
    a GaAlAs buffer layer formed on said active layer
    an InGaPAs optical guiding layer having a diffraction grating thereon formed on said buffer layer, and
    a GaAlAs second cladding layer formed on said optical guiding layer,
    wherein the width of the forbidden band of said buffer layer is greater than that of said active layer and smaller than that of said optical guiding layer.

12. A semiconductor laser device according to claim 11, wherein the forbidden band widths of said active layer, said buffer layer, said optical guiding layer, said first cladding layer, and second cladding layer are $E_3$, $E_9$, $E_4$, $E_2$, and $E_5$, respectively, the following relationships therebetween are achieved:

$E_3 < E_9 < E_4 < E_2 \text{\&} \ E_5$, and $E_2 \text{\&} E_5 - E_3 \geq 0.3$ eV.

13. A semiconductor laser device according to claim 12, wherein said optical guiding layer comprises $In_{1-y}Ga_yP_{1-z}As_z$ ($0.68 \leq y \leq 1$, $0.34 \leq z \leq 1$, and $z = 2.04y - 1.04$), and wherein said first cladding layer and said second cladding layer comprise $Ga_{1-x}Al_xAs$ ($0.2 \leq x \leq 1$).

14. A semiconductor laser device according to claim 13, wherein the refractive index of said optical guiding layer is between that of said active layer and that of said first and second cladding layers.

15. A semiconductor laser device according to claim 14, wherein said diffraction grating on said optical guiding layer comprises a corrugation having a periodicity of 2500 angstroms.

16. A semiconductor laser device according to claim 15, wherein said first cladding layer is formed on a semiconductor substrate, a cap layer is formed on said second cladding layer, and electrodes are formed on said cap layer and said substrate.

* * * * *